(12) United States Patent
Liu et al.

(10) Patent No.: US 11,199,298 B2
(45) Date of Patent: Dec. 14, 2021

(54) METHOD FOR MANUFACTURING LIGHT EMITTING DIODE FILAMENT

(71) Applicant: ZHONGSHAN MLS ELECTRONIC CO., LTD, Zhongshan (CN)

(72) Inventors: Jiwei Liu, Zhongshan (CN); Yu Yang, Zhongshan (CN); Ji-An Meng, Zhongshan (CN); Sheng Huang, Zhongshan (CN); Qinglin Yao, Zhongshan (CN); Hongli Shi, Zhongshan (CN)

(73) Assignee: ZHONGSHAN MLS ELECTRONIC CO., LTD, Zhongshan (CN)

( * ) Notice: Subject to any disclaimer, the term of this patent is extended or adjusted under 35 U.S.C. 154(b) by 98 days.

(21) Appl. No.: 16/744,112

(22) Filed: Jan. 15, 2020

(65) Prior Publication Data
US 2021/0172573 A1    Jun. 10, 2021

(30) Foreign Application Priority Data
Dec. 6, 2019   (CN) .......................... 201911241236.3

(51) Int. Cl.
| | |
|---|---|
| *H01L 21/66* | (2006.01) |
| *F21K 9/90* | (2016.01) |
| *H01L 25/13* | (2006.01) |
| *H01L 25/16* | (2006.01) |
| *H01L 33/56* | (2010.01) |
| *H01L 33/62* | (2010.01) |

(52) U.S. Cl.
CPC ................ *F21K 9/90* (2013.01); *H01L 25/13* (2013.01); *H01L 25/167* (2013.01); *H01L 33/56* (2013.01); *H01L 33/62* (2013.01)

(58) Field of Classification Search
CPC ......... F21K 9/90; H01L 25/13; H01L 25/167; H01L 33/56; H01L 33/62; H01L 25/0753; H01L 33/52; H01L 2933/005; H01L 2933/0066
See application file for complete search history.

(56) References Cited

U.S. PATENT DOCUMENTS

| | | | |
|---|---|---|---|
| 2015/0082955 A1* | 3/2015 | Zhou ..................... | H05K 1/0286 83/39 |
| 2017/0025591 A1* | 1/2017 | Yao ........................... | F21K 9/90 |
| 2017/0084809 A1* | 3/2017 | Jiang ...................... | H01L 33/56 |
| 2017/0167667 A1* | 6/2017 | Ma .......................... | F21K 9/232 |
| 2018/0328544 A1* | 11/2018 | Rieder ................... | F21V 3/049 |

(Continued)

*Primary Examiner* — Ismail A Muse

(57) ABSTRACT

The present application discloses a method for manufacturing an LED filament, which includes: operation , a plurality of metal sheets are provided and arranged at least two rows in parallel; operation S2, a plurality of brackets are provided, and each bracket is located between two corresponding metal sheets and fixedly connected to the two metal sheets; operation S3, a plurality of LED chips are provided and attached to each of the brackets, and the LED chips are electrically connected to the metal sheets by conducting wire; operation S4, each bracket, the LED chips defined on the bracket, the conducting wire defined on the bracket, and the joints of the bracket and the metal sheets are all cladded using packaging material to form an encapsulation layer, and the encapsulation layer, the bracket, the LED chips, the conducting wire, and the connected two metal sheets cooperatively form an LED filament.

10 Claims, 7 Drawing Sheets

(56) References Cited

U.S. PATENT DOCUMENTS

| | | | | |
|---|---|---|---|---|
| 2019/0115324 A1* | 4/2019 | Lee | ......................... | H01L 33/50 |
| 2019/0157250 A1* | 5/2019 | Windisch | ................ | F21V 29/87 |
| 2019/0338892 A1* | 11/2019 | Spehalski | ............... | F21K 9/235 |
| 2019/0338893 A1* | 11/2019 | Spehalski | ............... | F21K 9/238 |
| 2020/0064540 A1* | 2/2020 | Nichol | ................ | G02B 6/0016 |
| 2020/0111941 A1* | 4/2020 | Xing | .................... | H01L 33/387 |
| 2021/0119092 A1* | 4/2021 | Yao | ........................ | F21K 9/232 |

\* cited by examiner

METHOD FOR MANUFACTURING LIGHT EMITTING DIODE FILAMENT

CROSS REFERENCE TO RELATED APPLICATION

This application claims priority with respect to Chinese Patent Application No. 201911241236.3, filed Dec. 6, 2019, entitled "METHOD FOR MANUFACTURING LIGHT EMITTING DIODE FILAMENT", the disclosures of both foregoing applications being incorporated herein by reference.

FIELD OF THE PRESENT DISCLOSURE

The present disclosure relates to the field of light emitting diode (LED) filament, and more particularly to a method for manufacturing LED filaments.

DESCRIPTION OF RELATED ART

With a continuous development of light emitting diode technology, the research on LED street lamps has made a breakthrough progress. The current LED street lamps are almost direct current (DC) droved, that is, a mature switching power supply technology is used to turn the alternating current (AC) into DC to drive the LED filament.

Currently, DC driving has become a mainstream driving method since it can provide stable current for LED. However, the development of DC driving may be restricted by the bottlenecks of using life and cost. Simultaneously, it is very complicated to manufacture a DC droved filament, which further raises the cost.

SUMMARY OF THE PRESENT DISCLOSURE

In one aspect of the present disclosure, the present disclosure provides a method for manufacturing an LED filament, and the method includes the following operations S1 to S4. Operation S1, a plurality of metal sheets are provided and arranged at least two rows in parallel, each metal sheet at one row has one end extending to the corresponding metal sheet at the other row, and the other ends of each of the metal sheets connect with each other to form a positioning portion; operation S2, a plurality of brackets are provided, and each bracket is located between two corresponding metal sheets and fixedly connected to the two metal sheets; operation S3, a plurality of LED chips are provided and attached to each of the brackets, and the LED chips are electrically connected to the metal sheets by conducting wire; or, each bracket is prefabricated with conducting strip, and the LED chips are attached to the bracket and electrically connected to the metal sheets by the conducting strip; operation S4, each bracket, the LED chips defined on the bracket, the conducting strip or the conducting wire defined on the bracket, and the joints of the bracket and the metal sheets are all cladded using packaging material to form an encapsulation layer, and the encapsulation layer, the bracket, the LED chips, the conducting strip or conducting wire, and the connected two metal sheets cooperatively form an LED filament.

BRIEF DESCRIPTION OF THE DRAWINGS

To clearly illustrate the technical solutions that are reflected in various embodiments according to this disclosure, the accompanying drawings intended for the description of the embodiments herein will now be briefly described. It is evident that the accompanying drawings listed in the following description show merely some embodiments according to this disclosure, and that those having ordinary skill in the art will be able to obtain other drawings based on the arrangements shown in these drawings without making inventive efforts.

DETAILED DESCRIPTION OF THE EXEMPLARY EMBODIMENT

The technical solutions of the embodiments of the present disclosure will be clearly and completely described in the following with reference to the accompanying drawings.

It is understood that, reference to "embodiment" herein means that a particular feature, structure, or characteristic described may be included in at least one embodiment of the disclosure. The appearances of "embodiment" in various places in the specification are not necessarily all referring to the same embodiment, nor are they independent or alternative embodiments that are mutually exclusive with other embodiments. It is clearly and implicitly understood by those skilled in the art that the embodiments described herein may be combined with other embodiments.

Please referring to FIGS. 1 to 6, the method for manufacturing an LED filament according to the present disclosure includes the following operations.

Operation S1, a plurality of metal sheets are provided and arranged at least two rows in parallel, each metal sheet 10 at one row has one end extending to the corresponding metal sheet at the other row, and the other ends of each of the metal sheets connect with each other to form a positioning portion.

Figure 1:
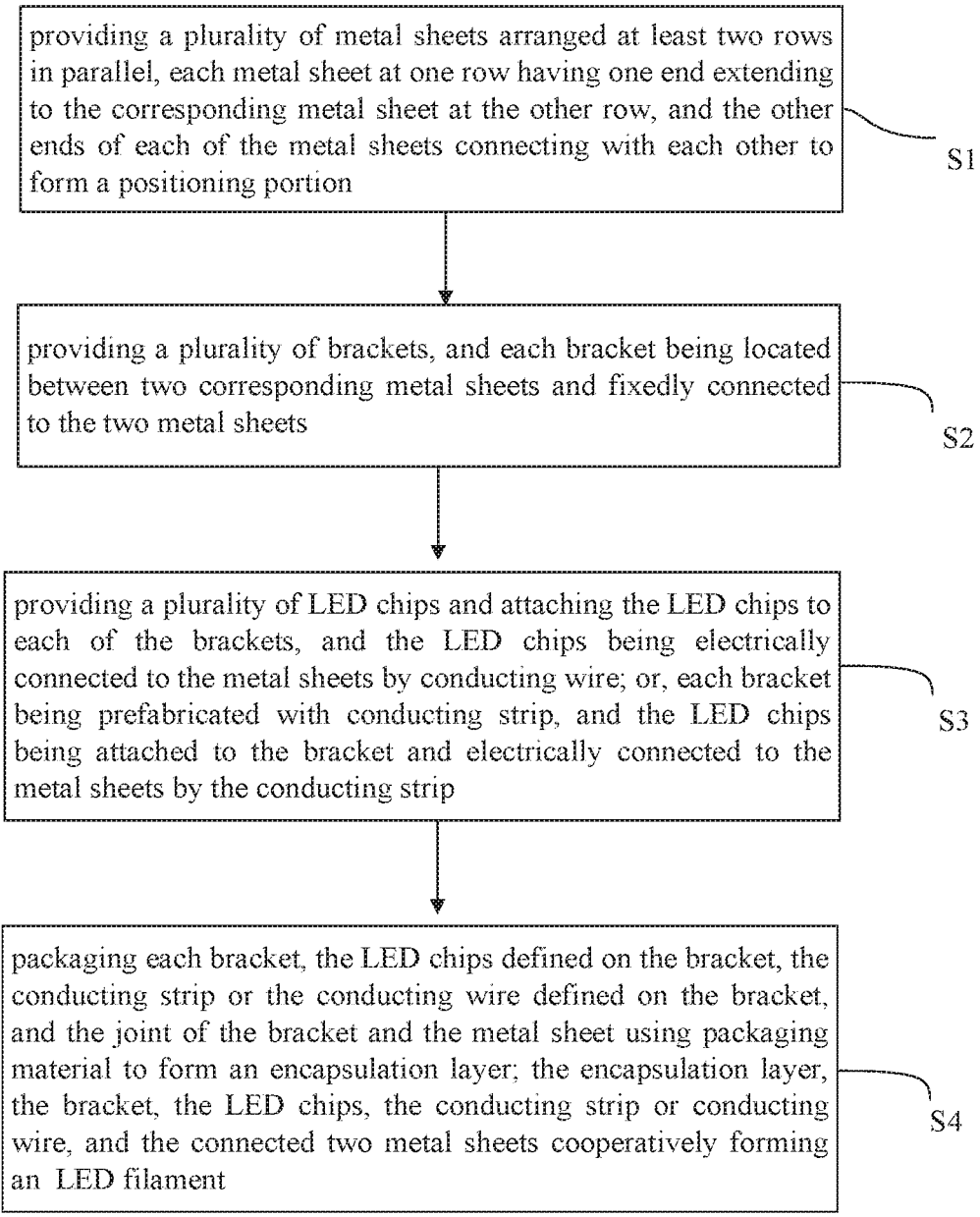
FIG. 1 is a flow chart of a method for manufacturing LED filament in accordance with an embodiment of the present disclosure.
Figure 2:
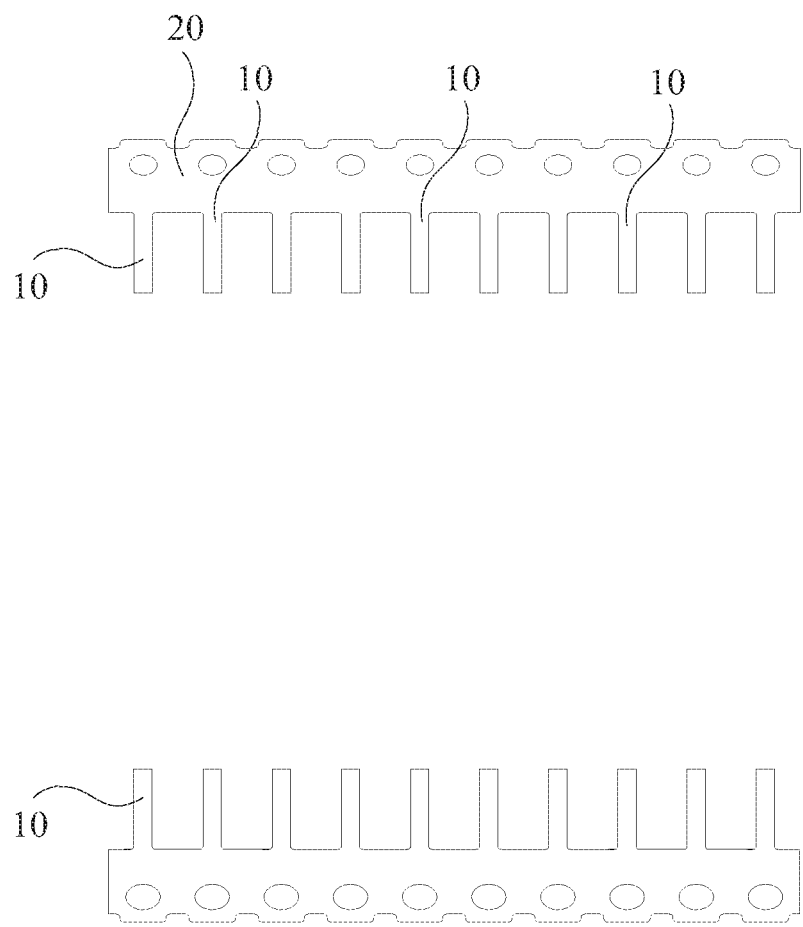
FIG. 2 is a schematic diagram of two rows of metal sheet as mentioned in operation S1 of FIG. 1.

Specifically, please referring to FIG. 2, in one embodiment, two rows of metal sheet 10 are prepared. The metal sheet 10 may be made of metal with good conductive properties. The metal sheet 10 may be obtained by dividing metal strips made in rolls into reasonable length, such as 120 millimeters or 144 millimeters. The two rows of metal sheet 10 may also be obtained by stamping an integral metal piece.

The two rows of metal sheet 10 are arranged in parallel and spaced apart from each other, and each of the metal sheets 10 in a same row is aligned with each other.

Each metal sheet 10 at one row has one end extending to the corresponding metal sheet 10 at the other row, and the other ends of each metal sheet 10 connects with each other to form a positioning portion 20. The positioning portion 20 is further defined with a plurality of positioning through holes 210.

In some embodiments, the metal strips may be divided into thirty-six or forty or forty-eight metal sheets 10 arranged in parallel and spaced apart from each other, the interval between every two adjacent metal sheets 10 is equal, and the interval may be 1 millimeter to 9 millimeters.

Operation S2, a plurality of brackets are provided, and each bracket is located between two corresponding metal sheets and fixedly connected to the two metal sheets.

Figure 3:
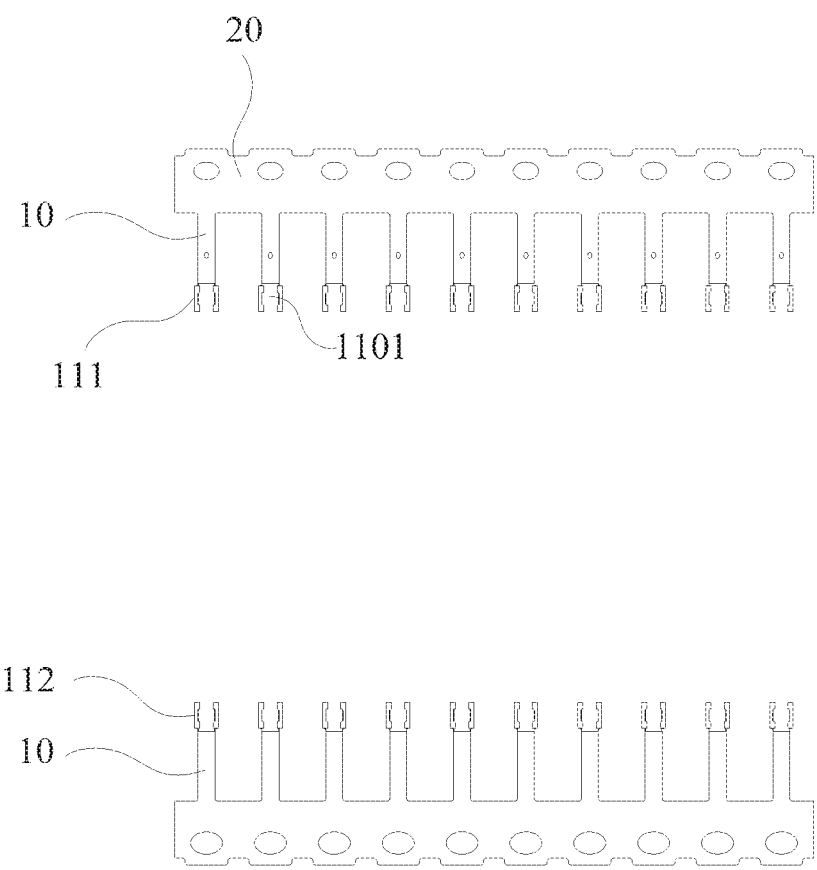
FIG. 3 is a schematic diagram of two rows of metal sheet as mentioned in operation S2 of FIG. 1 with a clamping portion manufactured.
Figure 4:
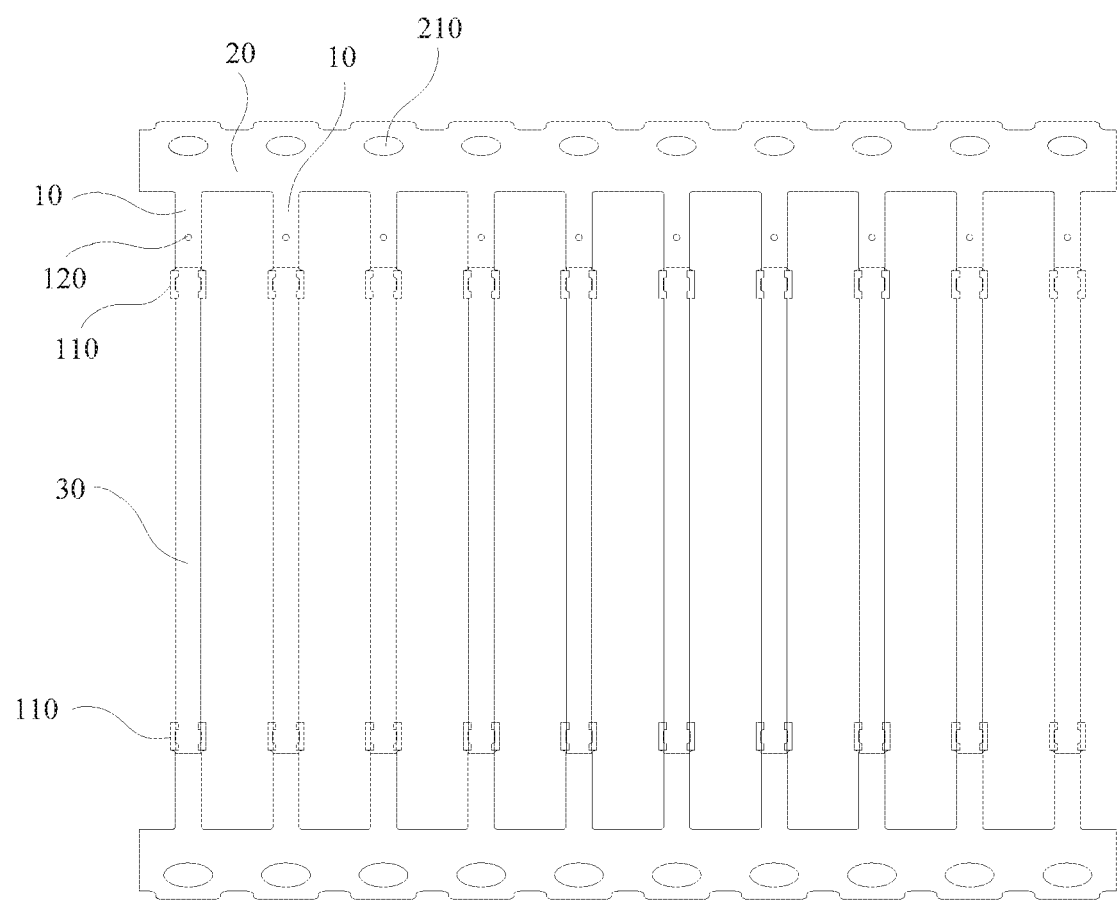
FIG. 4 is a schematic diagram showing the operation S2 in FIG. 1, with brackets being fixed between the two rows of metal sheet.
Figure 5A:
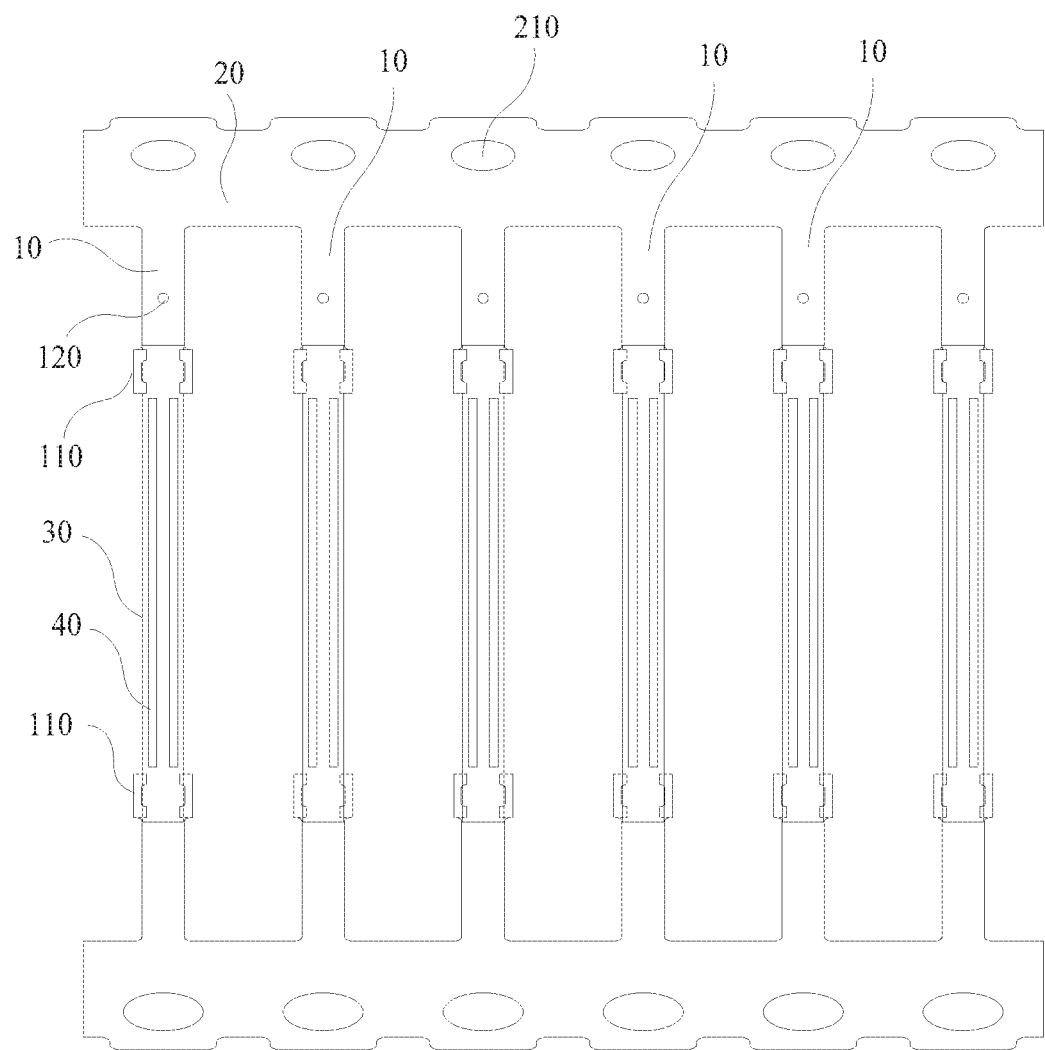
FIGS. 5a to 5d are schematic diagrams showing the operation S3 in FIG. 1, with the bracket being prefabricated with conducting strip and attached with LED chips and rectifier module; one of the brackets is taken as an example here.
Figure 5B:
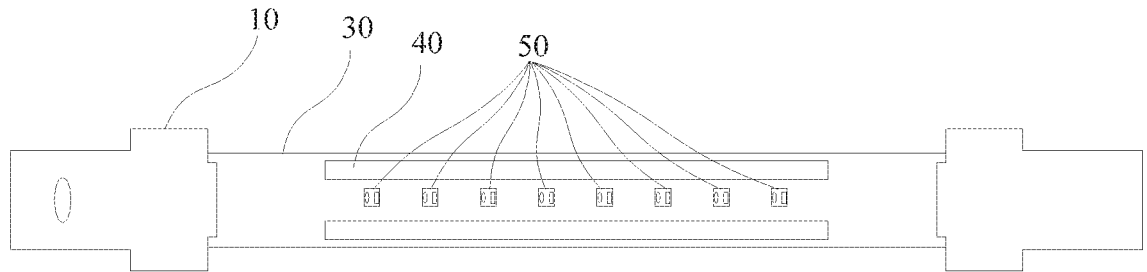
Figure 5C:
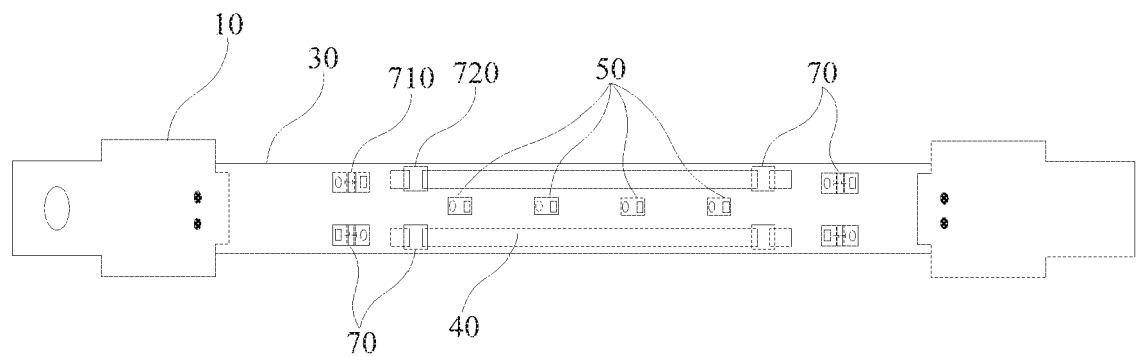
Figure 5D:
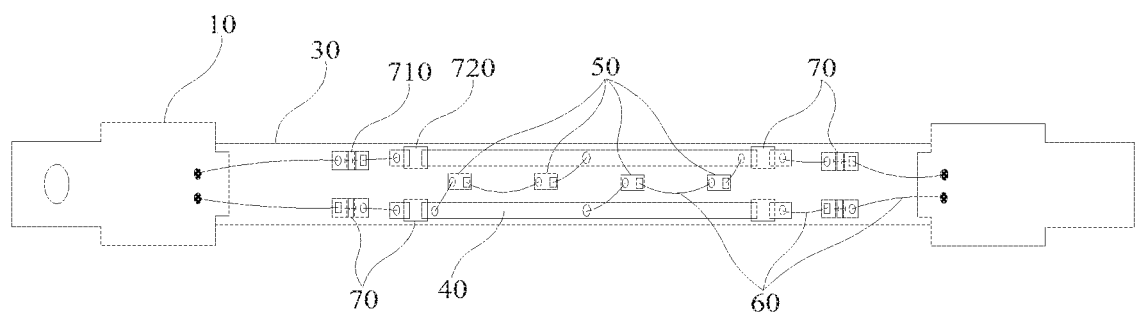
Figure 6:
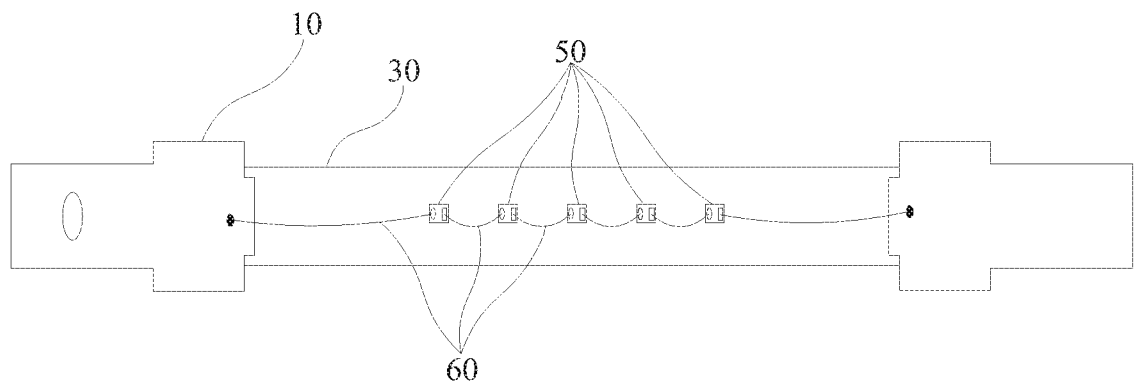
FIG. 6 is a schematic diagram showing the operation S3 according to another embodiment, with the bracket being attached with LED chips, and the LED chips being electrically connected with the metal sheets by conducting wire; one of the brackets is taken as an example here.
Figure 7:
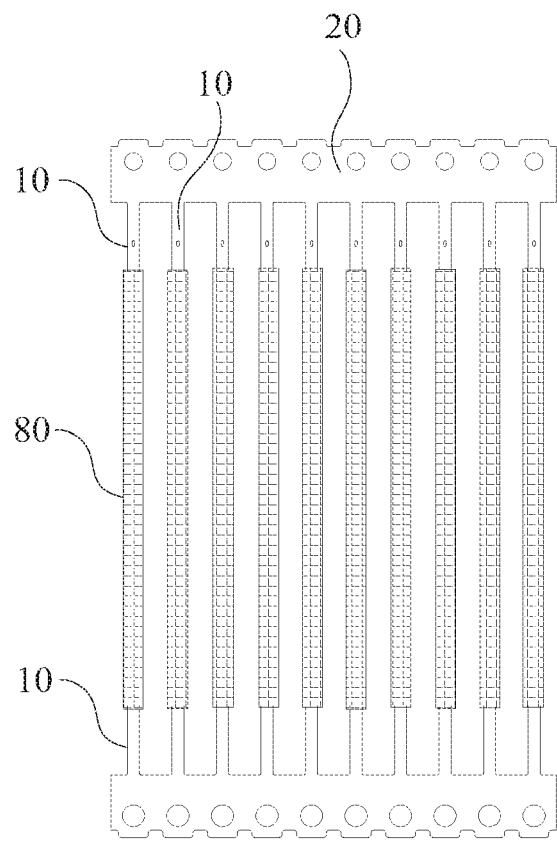
FIG. 7 is a schematic diagram showing the operation S4 in FIG. 1, with the bracket, all kinds of elements attached on the bracket, and the joints of the bracket and the metal sheets being packaged using packaging material.

Specifically, referring to FIG. 3, a plurality of brackets 30 are prepared, each bracket 30 is fixedly connected with two metal sheets 10, and the two metal sheets 10 are located in different rows and facing to each other. As such, each two corresponding metal sheets 10 are connected by a bracket 30.

In some embodiments, the bracket 30 may be obtained by dividing a bracket assembly, which includes a plurality of brackets connected in parallel side by side. The bracket assembly may include thirty-six or forty or forty-eight brackets, and is made of ceramic or glass. Each of the brackets 30 may have a same width, such as 0.8 millimeters, 1.0 millimeter, 1.5 millimeters, or 3.0 millimeters. It should be understood that, the width of each of the bracket 30 may not be the same, and may be set according to an actual need.

In some embodiments, in the operation S2, one end of each of the metal sheets 10 is defined with a clamping portion 110 for clamping the bracket 30. Specifically, the clamping portion 110 includes a pair of clamping pieces 111 and 112 and the clamping pieces 111 and 112 face to each other and are spaced apart from each other. The pair of clamping pieces are respectively bent and extended from opposite two sides of the metal sheet, and cooperatively define a receiving cavity 1101 with the metal sheet 10, so that the end of the bracket 30 can be received in the receiving cavity 1101. It can be understood that, the clamping portion 110 can also be integrally formed with the metal sheet 10 in operation S1.

In some embodiments, there is a one-to-one correspondence between the plurality of positioning through holes 210 and the brackets 30, so as to facilitate the positioning of the brackets 30 when being connected to the metal sheets 10.

In some embodiments, each of the metal sheets 10 is further defined with a marking hole 120. The marking hole 120 is configured to identify the positive pole and negative pole of the metal sheet 10, for instance, the metal sheet 10 having the marking hole 120 is set as a positive pole, and the metal sheet 10 without the marking hole 120 is set as a negative pole, or vice versa. The marking hole 120 may facilitate the identification of the positive pole and the negative pole in a subsequent process of solid-state wire bonding. It should be understood that the marking hole 120 may also be integrally formed with the metal sheet 10 in operation S1.

Operation S3, a plurality of LED chips are provided and attached to each of the brackets, and the LED chips are electrically connected to the metal sheets 10 by conducting wire; or, each bracket 30 is prefabricated with conducting strip, and the LED chips are attached to the bracket 30 and electrically connected to the metal sheets 10 by the conducting strip.

Specifically, referring to FIGS. 4a to 4d, in one embodiment, one of the brackets 30 is taken as an example. The bracket 30 is printed with two conducting strips 40 at two sides of the bracket 30. Then, a set number of LED chips 50 are sequentially attached to the bracket 30 and positioned between the two conducting strips 31. Finally, each of the conducting strips 40 is electrically connected to the metal sheets 10 located near to its both ends by welding lead, and the LED chips 50 are electrically connected to the conducting strips 40 via conducting wires.

The LED chips 50 may be high-voltage chips or low-voltage chips, which is not limited in the present disclosure.

Each bracket 30 may also be attached with a rectifier module 70, which is positioned at an end of the bracket 30 closing to the metal sheet 10.

The rectifier module 70 may specifically include a rectifier bridge 710 and a protective resistor 720. The rectifier bridge 710 may be consisted of four high-voltage LED chips with different conduction directions, so as to be able to convert external AC power to DC power to enable the LED chips 50. The protective resistor 720 is configured for stabilizing the current and voltage when the LED filament is forwarded and reversely cut-off, so as to effectively avoid the AC LED filament from breakdown due to overcurrent and overvoltage during work. In other embodiments, the rectifier module 70 may include only the rectifier bridge 710, which is not limited in the present disclosure.

It should be understood that, by arranging the rectifier module 70 on the bracket 30, the LED filament that is finally manufactured can be directly connected to an AC power, which takes a lower cost than that of the conventional DC filament, and the power supply adopted for the LED filament may also be a lowcost power supply. Further, the stability of the AC LED filament is effectively improved, and the occurrence of die modulation phenomenon which may be caused by the instability of a crude power supply's filtering and voltage reduction is reduced. In addition, the method for manufacturing the AC LED filament does not need many of the components as used in many power supply solutions, such as expensive rectifiers and capacitors, thereby further reducing the cost.

Please referring to FIG. 5, according to another embodiment of the present disclosure, a set number of LED chips 50, such as eight or ten LED chips 50, are sequentially arranged and fixed to the bracket 30 and electrically connected with each other through a conducting wire 60, and the LED chips 50 are then electrically connected to the corresponding metal sheets 10 by the conducting wire 60.

Optionally, the quantity of the LED chips 50 attached to the bracket 30 may be set according to actual requirement. Other logical circuits can also be set by setting reasonable bonding positions and wire bonding methods. It is not limited in the present disclosure.

Operation S4, each bracket, the LED chips defined on the bracket, the conducting strip or the conducting wire defined on the bracket, and the joints of the bracket and the metal sheets are all cladded using packaging material to form an encapsulation layer 80, and the encapsulation layer 80, the bracket 30, the LED chips 50, the conducting strips 40 and/or conducting wires 60, and the connected two metal sheets 10 cooperatively form an LED filament.

Specifically, in one embodiment, after the LED chips 50 being attached to the bracket 30 and electrically connected to the metal sheets 10 by conducting strip 40 and/or conducting wire 60, packaging material is used to package the bracket 30, the LED chips 50 and conducting strip 40 (and/or conducting wire 60), and the joints of the bracket 30 and the metal sheets 10 to form an encapsulation layer 80. The encapsulation layer 80, the bracket 30, the LED chips 50, the conducting strip 40 or conducting wire 60, and the connected two metal sheets 10 cooperatively form the final LED filament. Specifically, the clamping portion 110 is also cladded by the encapsulation layer 80.

The packaging layer 80 may completely isolate the LED chips 50 and the bracket 30 from air, so that oxidation of the LED chips 50 and the bracket 30 may be avoided, and a good environment is provided for the LED chips 50 to run well in a confined space. As such, the using life of the LED filament is also greatly improved. The encapsulation layer 80 also wraps the joints of the metal sheets 10 and the bracket 30, which may reduce the possibility of the joints from being broken due to external influences, thereby the using life of the LED filament is further improved.

The packaging material used for the packaging layer 80 may be one or more selected from a group consisting of silicone, rubber, resin, and fluorescent powder. It is not limited in the present disclosure.

In some embodiments, the method for manufacturing LED filament further includes operation S5 subsequent to the operation S4.

Operation S5, the metal sheet 10 is cut off at a position located between the positioning portion 20 and the joint of the bracket and the metal sheet to obtain separate LED filaments. The joint relates to the clamping portion for clamping the bracket.

Specifically, the metal sheet 10 is cut off at each of the positions located between the positioning portion 20 and the joint of the bracket 30 and the metal sheet 10, to obtain a plurality of separate LED filaments.

More specifically, the metal sheet 10 is cut off at each of the positions between the marking hole 120 and the positioning through hole 210, to obtain a plurality of LED filaments for separately using.

Compared to the related art, the method for manufacturing LED filament in the present disclosure can produce LED filament groups in batches, which simples the process and reduces the cost. Further, the encapsulation layer may completely isolate the LED chips and the brackets from air, so that oxidation of the LED chips and the brackets may be avoided, and a good environment is provided for the LED chips to run well in a confined space. As such, the using life of the LED filament is also greatly improved.

It is to be understood, however, that even though numerous characteristics and advantages of the present exemplary embodiment have been set forth in the foregoing description, together with details of the structures and functions of the embodiment, the disclosure is illustrative only, and changes may be made in detail, especially in matters of shape, size, and arrangement of parts within the principles of the disclosure to the full extent indicated by the broad general meaning of the terms where the appended claims are expressed.

What is claimed is:

1. A method for manufacturing an LED filament, comprising:
    operation S1, providing a plurality of metal sheets arranged at least two rows in parallel, each metal sheet at one row having one end extending to the corresponding metal sheet at the other row, and the other ends of each of the metal sheets connecting with each other to form a positioning portion;
    operation S2, providing a plurality of brackets, and each bracket being located between two corresponding metal sheets and fixedly connected to the two metal sheets;
    operation S3, providing a plurality of LED chips and attaching the LED chips to each of the brackets, and the LED chips being electrically connected to the metal sheets by conducting wire; or,
    each bracket being prefabricated with conducting strip, and the LED chips being attached to the bracket and electrically connected to the metal sheets by the conducting strip;
    operation S4, packaging each bracket, the LED chips defined on the bracket, the conducting strip or the conducting wire defined on the bracket, and the joint of the bracket and the metal sheet using packaging material to form an encapsulation layer; the encapsulation layer, the bracket, the LED chips, the conducting strip and/or conducting wire, and the connected two metal sheets cooperatively forming the LED filament; and
    each of the brackets is attached with a rectifier module, and the rectifier module is defined at an end of the bracket closing to the metal sheet.

2. The method according to claim 1, further comprising:
    operation S5, cutting off the metal sheet at a position located between the positioning portion and the joint of the bracket and the metal sheet to obtain a separate LED filament.

3. The method according to claim 2, wherein the positioning portion is defined with a plurality of positioning through holes.

4. The method according to claim 3, wherein the plurality of positioning through holes are corresponding to each of the brackets.

5. The method according to claim 1, wherein each of the metal sheets defines a clamping part for clamping the bracket.

6. The method according to claim 5, wherein the clamping part comprises a pair of clamping pieces facing and spaced from each other, the pair of clamping pieces are respectively bent and extended from opposite two sides of the metal sheet, the pair of clamping pieces and the metal sheet cooperatively form a receiving cavity, and the end of the bracket is received in the receiving cavity.

7. The method according to claim 2, wherein each of the metal sheets in one row is defined with a marking hole.

8. The method according to claim 7, wherein in operation S5, the metal sheet is cut off at the position located between the positioning through hole and the marking hole to obtain the LED filament.

9. The method according to claim 1, wherein the packaging material comprises silicone, rubber, or resin.

10. The method according to claim 1, wherein the bracket is made of ceramic or glass.

* * * * *